US009991019B2

(12) United States Patent
Hatakeyama et al.

(10) Patent No.: US 9,991,019 B2
(45) Date of Patent: *Jun. 5, 2018

(54) CONDUCTIVE POLYMER COMPOSITE AND SUBSTRATE

(71) Applicant: SHIN-ETSU CHEMICAL CO., LTD., Tokyo (JP)

(72) Inventors: Jun Hatakeyama, Jyoetsu (JP); Takayuki Nagasawa, Jyoetsu (JP); Koji Hasegawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 23 days.

This patent is subject to a terminal disclaimer.

(21) Appl. No.: 15/244,513

(22) Filed: Aug. 23, 2016

(65) Prior Publication Data

US 2017/0062089 A1 Mar. 2, 2017

(30) Foreign Application Priority Data

Aug. 27, 2015 (JP) ................................ 2015-167917

(51) Int. Cl.
*H01B 1/12* (2006.01)
*H05K 1/09* (2006.01)

(52) U.S. Cl.
CPC ............... *H01B 1/127* (2013.01); *H05K 1/09* (2013.01)

(58) Field of Classification Search
CPC ................................ H01B 1/127; H05K 1/09
See application file for complete search history.

(56) References Cited

U.S. PATENT DOCUMENTS

| | | | |
|---|---|---|---|
| 2006/0047030 | A1 | 3/2006 | Yoshida et al. |
| 2012/0012795 | A1 | 1/2012 | Hsu |

FOREIGN PATENT DOCUMENTS

| | | | |
|---|---|---|---|
| JP | 2006-096975 | A | 4/2006 |
| JP | 2008-146913 | A | 6/2008 |
| JP | 5264723 | B2 | 8/2013 |
| JP | 2013-228447 | A | 11/2013 |

*Primary Examiner* — Mark Kopec
*Assistant Examiner* — Jaison P Thomas
(74) *Attorney, Agent, or Firm* — Oliff PLC

(57) ABSTRACT

A conductive polymer composite includes: a π-conjugated polymer, and a dopant polymer which contains a repeating unit of general formula (1) and having a weight-average molecular weight of 1,000-500,000. The conductive polymer composite which has excellent filterability and film-formability by spin coating, and can form a conductive film having high transparency and excellent flatness.

(1)

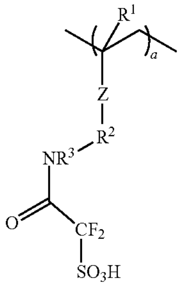

$R^1$ represents a hydrogen atom or methyl group; $R^2$ represents any of a single bond, ester group, and linear, branched, or cyclic hydrocarbon group having 1 to 12 carbon atoms, the hydrocarbon group optionally containing any one or more of an ether group, ester group, and amide group; "Z" represents any of a single bond, phenylene group, naphthylene group, ether group, and ester group; $R^3$ represents a hydrogen atom or alkyl group having 1 to 4 carbon atoms, and may be bonded to $R^2$ to form a ring; and "a" is a number satisfying $0<a\leq1.0$.

20 Claims, No Drawings

CONDUCTIVE POLYMER COMPOSITE AND SUBSTRATE

BACKGROUND OF THE INVENTION

Field of the Invention

The present invention relates to a conductive polymer composite and a substrate having a conductive film formed thereon from the conductive polymer composite.

Description of the Related Art

A polymer having a conjugated double bond (i.e. π-conjugated polymer) does not show a conductivity by itself; however, if an appropriate anionic molecule is doped therein, it can express a conductivity, thereby giving a conductive polymer material (i.e. conductive polymer composition). As to the π-conjugated polymer, polyacetylene, (hetero) aromatic polymers such as polythiophene, polyselenophene, polytellurophene, polypyrrole, and polyaniline; a mixture thereof, etc., are used; and as to the anionic molecule (dopant), an anion of sulfonic acid type is most commonly used. This is because a sulfonic acid, which is a strong acid, can efficiently interact with the aforementioned α-conjugated polymers.

As to the anionic dopant of sulfonic acid type, sulfonic acid polymers such as polyvinyl sulfonic acid and polystyrene sulfonic acid (PSS) are widely used (Patent Document 1). The sulfonic acid polymer includes a vinylperfluoroalkyl ether sulfonic acid typified by Nafion®, which is used for a fuel cell.

Polystyrene sulfonic acid (PSS), which is a sulfonic-acid homopolymer, has a sulfonic acid as a repeated monomer unit in the polymer main chain, so that it has a high doping effect to the π-conjugated polymer, and also can enhance water dispersibility of the π-conjugated polymer after being doped. This is because the hydrophilicity is kept due to the sulfo groups excessively present in PSS, and the dispersibility into water is therefore enhanced dramatically.

Polythiophene having PSS as a dopant exhibits high conductivity and can be handled as an aqueous dispersion, so that it is expected to be used as a coating-type conductive film material in place of ITO (indium-tin oxide). As mentioned above, however, PSS is a water-soluble resin, and is hardly soluble in an organic solvent. Accordingly, the polythiophene having PSS as a dopant has a high hydrophilicity, but a low affinity to an organic solvent and an organic substrate, and thus, it is difficult to disperse it into an organic solvent and to form a film onto an organic substrate.

Besides, when the polythiophene having PSS as a dopant is used in, for example, a conductive film for an organic EL lighting, a large quantity of water tends to remain in the conductive film and the conductive film thus formed tends to absorb moisture from an outside atmosphere since the polythiophene having PSS as a dopant has an extremely high hydrophilicity as mentioned above. As a result, the problems arise that the luminous body of the organic EL chemically changes, thereby the light emitting capability is deteriorated, and that water agglomerates over time and defects are caused, which results in shortening of the lifetime of the whole organic EL device. Furthermore, there arise other problems in the polythiophene having PSS as a dopant that particles in the aqueous dispersion becomes large, the film surface becomes rough after the film formation, and a non-light emitting region, called dark spot, is caused when used for the organic EL lighting.

In addition, since the polythiophene having PSS as a dopant has an absorption at a wavelength of about 500 nm in the blue region, in the case that this material is used as a film coating a transparent substrate such as a transparent electrode, there arises another problem that when the conductivity required for the device to function is made up by the solid concentration or the thickness of the film, transmittance of the film is affected.

Patent Document 2 discloses a conductive polymer composition composed of a conductive polymer which contains a π-conjugated polymer formed of a repeating unit selected from thiophene, selenophene, tellurophene, pyrrole, aniline, and a polycyclic aromatic compound, and a fluorinated acid polymer which can be wetted by an organic solvent and 50% or more of which is neutralized by a cation; and it is shown that an aqueous dispersion of the conductive polymer can be obtained by combining water, a precursor monomer of the π-conjugated polymer, the fluorinated acid polymer, and an oxidant, in any order.

However, in such a conventional conductive polymer, particles are agglomerated in the dispersion immediately after synthesis. Also, if an organic solvent served as a conductive enhancer is added thereto to give a coating material, the agglomeration is further facilitated, so that the filterability thereof is deteriorated. If the coating material is applied by spin coating without filtration, a flat film cannot be obtained due to the effect of the particle agglomeration; and as a result, the problem of coating defect is caused.

Moreover, the polythiophene having PSS as a dopant can also be used as a hole injection layer. In this case, the hole injection layer is provided between a transparent electrode such as ITO and a light-emitting layer. The hole injection layer does not require high conductivity since the under transparent electrode ensures the conductivity. For the hole injection layer, no occurrence of dark spot and high hole-transporting ability are required.

PRIOR ART DOCUMENTS

Patent Documents

Patent Document 1: Japanese Patent Laid-Open Publication No. 2008-146913

Patent Document 2: Japanese Patent No. 5264723

SUMMARY OF THE INVENTION

As mentioned above, the polythiophene-based conductive polymer having PSS as a dopant, such as widely applicable PEDOT-PSS, has problems that it has poor transparency due to absorption in the visible light although having a high conductivity; it is difficultly purified by filtration since it has a strong agglomeration tendency in the state of the aqueous dispersion; and the film-formability by spin coating was poor and the surface where the film is formed was rough.

The present invention was made in view of the above-mentioned circumstances, and an object thereof is to provide a conductive polymer composite which has excellent filterability and film-formability by spin coating, and also can form a conductive film having high transparency and flatness when the film is formed from the composite.

To accomplish the object, the present invention provides a conductive polymer composite comprising:

(A) a π-conjugated polymer, and (B) a dopant polymer which contains a repeating unit "a" shown by the following general formula (1) and having a weight-average molecular weight in the range of 1,000 to 500,000, (1)

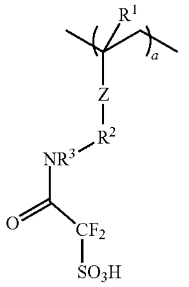

wherein $R^1$ represents a hydrogen atom or a methyl group; $R^2$ represents any of a single bond, an ester group, and a linear, branched, or cyclic hydrocarbon group having 1 to 12 carbon atoms, the hydrocarbon group optionally containing any one or more of groups selected from an ether group, an ester group, and an amide group; "Z" represents any of a single bond, a phenylene group, a naphthylene group, an ether group, and an ester group; $R^3$ represents a hydrogen atom or an alkyl group having 1 to 4 carbon atoms, and may be bonded to $R^2$ to form a ring; and "a" is a number satisfying $0<a\leq1.0$.

The conductive polymer composite as mentioned above has excellent filterability and film-formability onto an inorganic or organic substrate by spin coating, and also can form a conductive film having high transparency and flatness when the film is formed from the composite.

The repeating unit "a" in the component (B) preferably includes one or more kinds selected from a repeating unit a1 shown by the following general formula (1-1) and a repeating unit a2 shown by the following general formula (1-2), (1-1)

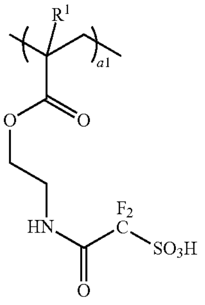

(1-2)

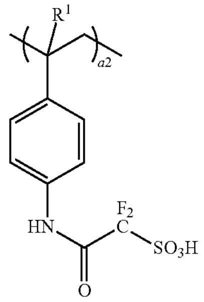

wherein $R^1$ has the same meaning as defined above; and a1 and a2 are each a number satisfying $0\leq a1\leq1.0$, $0\leq a2\leq1.0$, and $0<a1+a2\leq1.0$.

As described above, the foregoing are preferable as the component (B) and can improve the material in filterability, film-formability, affinity to an organic solvent and an organic substrate, and transparency after film formation.

The component (B) preferably further contains a repeating unit "b" shown by the following general formula (2), (2)

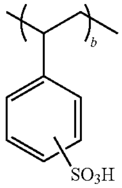

wherein "b" is a number satisfying $0<b<1.0$.

By containing the repeating unit "b", the conductivity of the material can be further enhanced.

The component (B) is preferably a block copolymer.

If the component (B) is a block copolymer, the conductivity of the material can be further enhanced.

The component (A) is preferably a polymer formed by polymerization of one or more precursor monomers selected from the group consisting of pyrrole, thiophene, selenophene, tellurophene, aniline, a polycyclic aromatic compound, and a derivative thereof.

Such monomers can be readily polymerized, and have excellent stability in air; and thus, the component (A) can be readily synthesized.

The conductive polymer composite preferably has dispersibility in water or in an organic solvent.

In addition, the present invention provides a substrate having a conductive film formed thereon, wherein the conductive film is formed from the above-mentioned conductive polymer composite.

Thus, the conductive polymer composite of the present invention can give a conductive film by applying it onto a substrate or the like to form a film thereon.

The conductive film thus formed has excellent conductivity and transparency, so that it may function as a transparent electrode layer.

As mentioned above, in the conductive polymer composite of the present invention, the dopant polymer of the component (B) which contains a superacidic sulfo group forms the composite together with the π-conjugated polymer of the component (A), whereby low viscosity, good filterability, and superior film-formability by spin coating are provided. In addition, when a film is formed from the inventive composite, a conductive film excellent in transparency, flatness, and conductivity as well as durability can be formed since the stability thereof to heat and light is improved. Further, the above-mentioned conductive polymer composite has excellent affinity to an organic solvent and an organic substrate, and excellent film-formability onto both an organic substrate and an inorganic substrate.

In addition, the conductive film formed from the above-mentioned conductive polymer composite has excellent conductivity, transparency, and the like, so that this film may function as a transparent electrode layer.

DETAILED DESCRIPTION OF THE PREFERRED EMBODIMENTS

As mentioned above, it has been desired to develop a conductive film-forming material which has excellent filterability and film-formability by spin coating, and can form a conductive film having high transparency and excellent flatness when the film is formed from the same.

The present inventors have diligently studied to accomplish the above-mentioned objects and consequently found that when a dopant polymer having a repeating unit that contains sulfa group, the α-position of which has been fluorinated, is used in place of polystyrene sulfonic acid (PSS), which has been widely used as a dopant of a conductive polymer material, the superacidic dopant polymer strongly interacts with the π-conjugated polymer, and therefore, the visible light absorption region of the it-conjugated polymer is shifted, which leads to improvement in transparency; and further, the π-conjugated polymer is strongly ionically bonded to the dopant polymer, which leads to improvement in stability to light and heat. Furthermore, they found that because the filterability could be improved, not only the film-formability by spin coating could be improved but also higher flatness of the film could be obtained at the timing of the film formation; thereby brought the present invention to completion.

That is, the present invention is a conductive polymer composite comprising:

(A) a π-conjugated polymer, and (B) a dopant polymer which contains a repeating unit "a" shown by the following general formula (1) and having a weight-average molecular weight in the range of 1,000 to 500,000, (1)

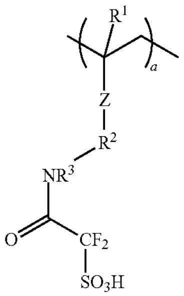

wherein $R^1$ represents a hydrogen atom or a methyl group; $R^2$ represents any of a single bond, an ester group, and a linear, branched, or cyclic hydrocarbon group having 1 to 12 carbon atoms, the hydrocarbon group optionally containing any one or more of groups selected from an ether group, an ester group, and an amide group; "Z" represents any of a single bond, a phenylene group, a naphthylene group, an ether group, and an ester group; $R^3$ represents a hydrogen atom or an alkyl group having 1 to 4 carbon atoms, and may be bonded to $R^2$ to form a ring; and "a" is a number satisfying $0<a\leq1.0$.

Hereinafter, the present invention will be described in detail, but the present invention is not limited thereto.

Herein, "conductive" means "electrically conductive."

[(A) π-Conjugated Polymer]

The conductive polymer composite of the present invention contains a it-conjugated polymer as component (A). The component (A) may be a polymer obtained by polymerization of a precursor monomer (i.e. organic monomer molecule) to form a π-conjugated chain which is a structure having a single bond and a double bond alternately and successively.

Illustrative examples of the precursor monomer include monocyclic aromatic compounds such as pyrroles, thiophenes, thiophene vinylenes, selenophenes, tellurophenes, phenylenes, phenylene vinylenes, and anilines; polycyclic aromatic compounds such as acenes; and acetylenes; and a homopolymer or a copolymer of these monomers can be used as the component (A).

Among these monomers, in view of easiness in polymerization and stability in air, pyrrole, thiophene, selenophene, tellurophene, aniline, a polycyclic aromatic compound, and a derivative thereof are preferable. Particularly preferable are pyrrole, thiophene, aniline, and a derivative thereof, though not limited thereto.

If the conductive polymer composite of the present invention particularly contains polythiophene as the component (A), it is expected to be developed into the application to touch panel, organic EL display, organic EL lighting, etc., because of its high conductivity and high transparency in the visible light. On the other hand, if the conductive polymer composite of the present invention contains polyaniline as the component (A), it is difficultly applied to display and so on since its absorption in the visible light is larger and the conductivity thereof is lower compared with the case of containing polythiophene, but it can be considered to use it for a top coat to prevent electric charge of the resist upper layer film by electrons in the EB (electron beam) lithography since it can be readily spin-coated because of low viscosity.

The component (A) may attain a sufficient conductivity even if the monomers which will constitute the π-conjugated polymer is not substituted; however, in order to further enhance the conductivity, monomers substituted with an alkyl group, a carboxy group, a sulfo group, an alkoxy group, a hydroxy group, a cyano group, a halogen atom, or the like may also be used.

Illustrative examples of the monomers of pyrroles, thiophenes, and anilines include pyrrole, N-methyl pyrrole, 3-methyl pyrrole, 3-ethyl pyrrole, 3-n-propyl pyrrole, 3-butyl pyrrole, 3-octyl pyrrole, 3-decyl pyrrole, 3-dodecyl pyrrole, 3,4-dimethyl pyrrole, 3,4-dibutyl pyrrole, 3-carboxy pyrrole, 3-methyl-4-carboxy pyrrole, 3-methyl-4-carboxyethyl pyrrole, 3-methyl-4-carboxybutyl pyrrole, 3-hydroxy pyrrole, 3-methoxy pyrrole, 3-ethoxy pyrrole, 3-butoxy pyrrole, 3-hexyloxy pyrrole, and 3-methyl-4-hexyloxy pyrrole; thiophene, 3-methyl thiophene, 3-ethyl thiophene, 3-propyl thiophene, 3-butyl thiophene, 3-hexyl thiophene, 3-heptyl thiophene, 3-octyl thiophene, 3-decyl thiophene, 3-dodecyl thiophene, 3-octadecyl thiophene, 3-bromo thiophene, 3-chloro thiophene, 3-iodo thiophene, 3-cyano thiophene, 3-phenyl thiophene, 3,4-dimethyl thiophene, 3,4-dibutyl thiophene, 3-hydroxy thiophene, 3-methoxy thiophene, 3-ethoxy thiophene, 3-butoxy thiophene, 3-hexyloxy thiophene, 3-heptyloxy thiophene, 3-octyloxy thiophene, 3-decyloxy thiophene, 3-dodecyloxy thiophene, 3-octadecyloxy thiophene, 3,4-dihydroxy thiophene, 3,4-dimethoxy thiophene, 3,4-diethoxy thiophene, 3,4-dipropoxy thiophene, 3,4-dibutoxy thiophene, 3,4-dihexyloxy thiophene, 3,4-diheptyloxy thiophene, 3,4-dioctyloxy thiophene, 3,4-didecyloxy thiophene, 3,4-didodecyloxy thiophene, 3,4-ethylenedioxy thiophene, 3,4-ethylenedithio thiophene, 3,4-propylenedioxy thiophene, 3,4-butenedioxy thiophene, 3-methyl-4-methoxy thiophene, 3-methyl-4-ethoxy thiophene, 3-carboxy thiophene, 3-methyl-4-carboxy thiophene, 3-methyl-4-carboxymethyl thiophene, 3-methyl-4-carboxyethyl thiophene, 3-methyl-4-carboxybutyl thiophene, 3,4-(2,2-dimethylpropylenedioxy)thlophene, 3,4-(2,2-diethylpropylenedioxy)thiophene, (2,3-dihydrothieno[3,4-b][1,4]dioxin-2-yl)methanol; aniline, 2-methyl aniline, 3-methyl aniline, 2-ethyl aniline, 3-ethyl aniline, 2-propyl aniline, 3-propyl aniline, 2-butyl aniline, 3-butyl aniline, 2-isobutyl aniline, 3-isobutyl aniline, 2-methoxy aniline, 2-ethoxy aniline, 2-aniline sulfonic acid, and 3-aniline sulfonic acid.

Among them, a (co)polymer consisting of one or two compounds selected from pyrrole, thiophene, N-methyl pyrrole, 3-methyl thiophene, 3-methoxy thiophene, and 3,4-ethylenedioxy thiophene is preferably used in view of resistance value and reactivity. Moreover, a homopolymer consisting of pyrrole or 3,4-ethylenedioxy thiophene has high conductivity; and therefore it is more preferable.

Meanwhile, for a practical reason, the repeat number of these repeating units (i.e. precursor monomers) in the component (A) is preferably in the range of 2 to 20, more preferably 6 to 15.

In addition, the molecular weight of the component (A) is preferably about 130 to about 5,000.

[(B) Dopant Polymer]

The conductive polymer composite of the present invention contains a dopant polymer as component (B). This dopant polymer of the component (B) is a superacidic polymer which contains a sulfonic acid, the α-position of which has been fluorinated, i.e. having a repeating unit "a" shown by the following general formula (1), (1)

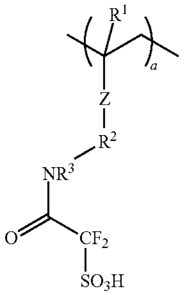

wherein $R^1$ represents a hydrogen atom or a methyl group; $R^2$ represents any of a single bond, an ester group, and a linear, branched, or cyclic hydrocarbon group having 1 to 12 carbon atoms, the hydrocarbon group optionally containing any one or more of groups selected from an ether group, an ester group, and an amide group; "Z" represents any of a single bond, a phenylene group, a naphthylene group, an ether group, and an ester group; $R^3$ represents a hydrogen atom or an alkyl group having 1 to 4 carbon atoms, and may be bonded to $R^2$ to form a ring; and "a" is a number satisfying $0<a\leq1.0$.

In the general formula (1), $R^1$ is a hydrogen atom or a methyl group.

$R^2$ is any of a single bond, an ester group, and a linear, branched, or cyclic hydrocarbon group having 1 to 12 carbon atoms, the hydrocarbon group optionally containing any one or more of groups selected from an ether group, an ester group, and an amide group. As the hydrocarbon group, for example, alkylene groups, arylene groups, alkenylene groups are mentioned.

"Z" is any of a single bond, a phenylene group, a naphthylene group, an ether group, and an ester group.

$R^3$ is a hydrogen atom or an alkyl group having 1 to 4 carbon atoms, and may be bonded to $R^2$ to form a ring.

"a" is a number satisfying $0<a\leq1.0$, preferably satisfying $0.2\leq a\leq1.0$.

Illustrative examples of the monomer to give the repeating unit "a" include the following compounds,

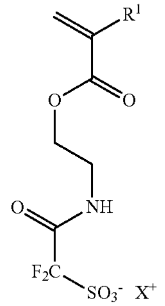
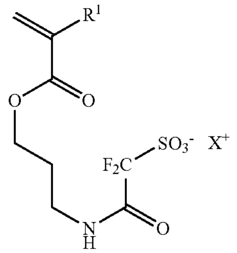
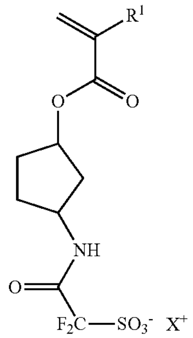
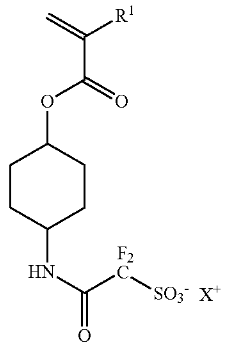
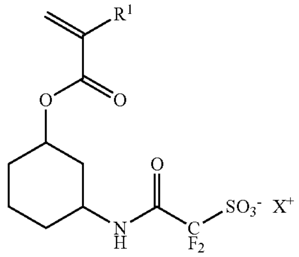
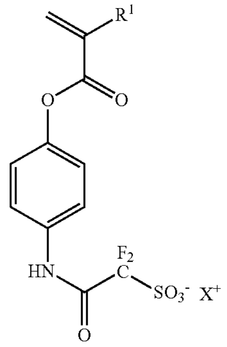
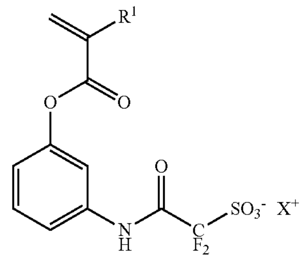
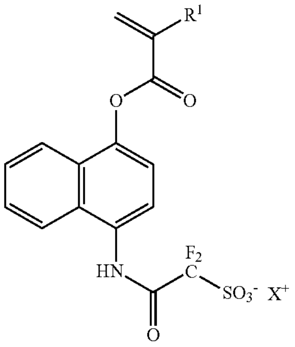
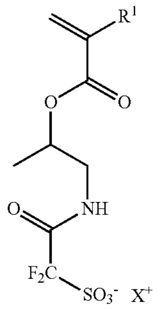

-continued
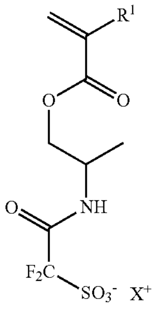
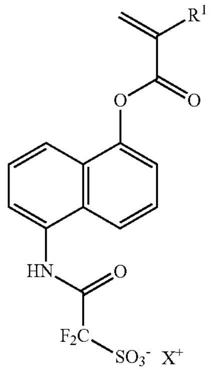
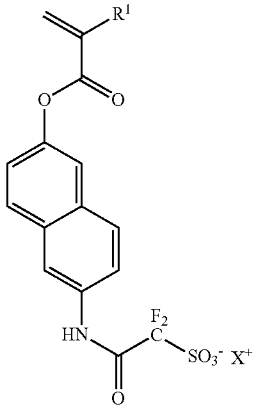
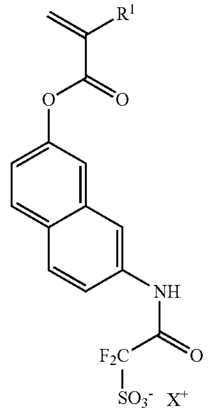
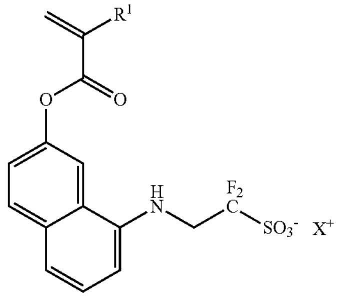
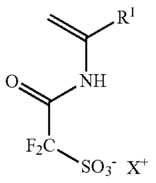
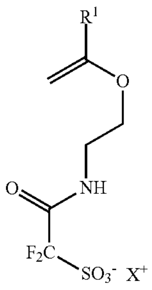
-continued
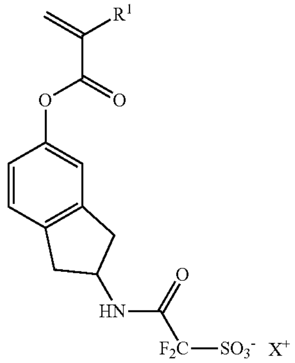
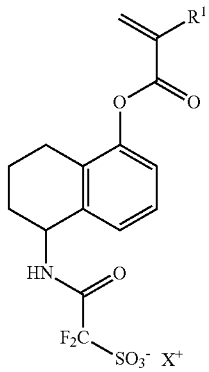
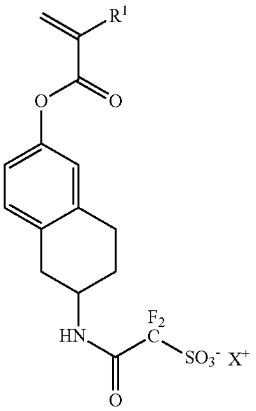
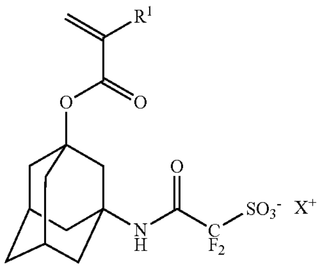
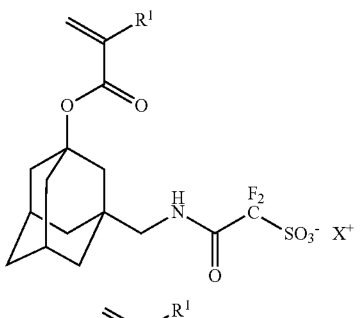
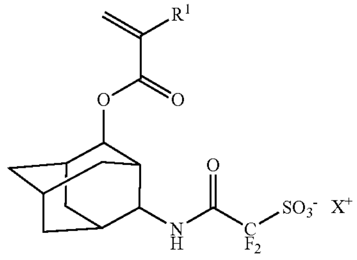

-continued
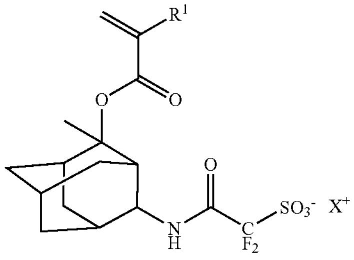
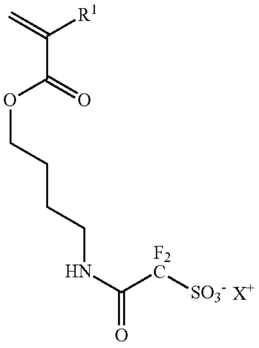
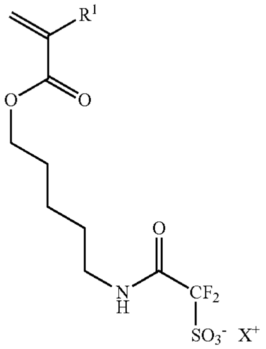
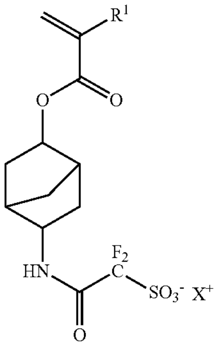
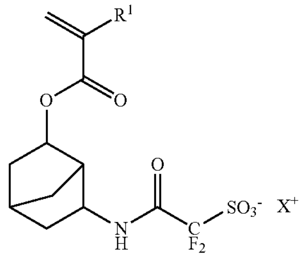
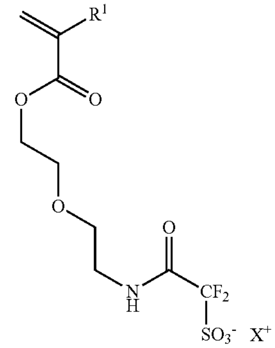
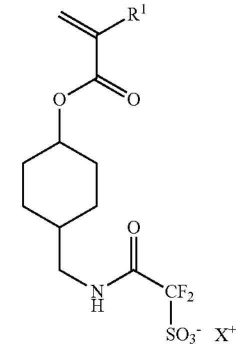
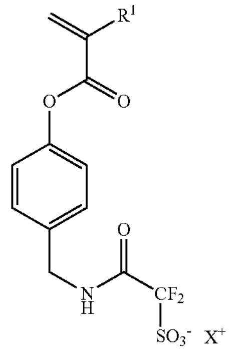
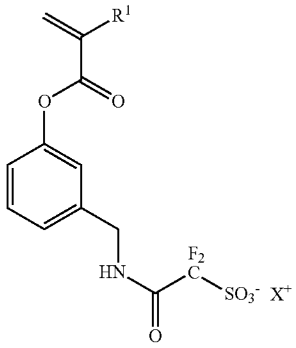
-continued
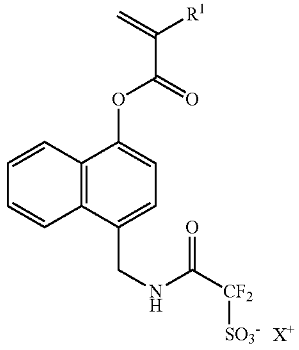
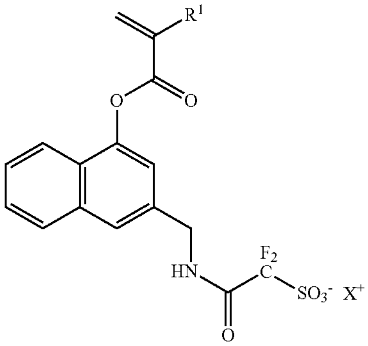
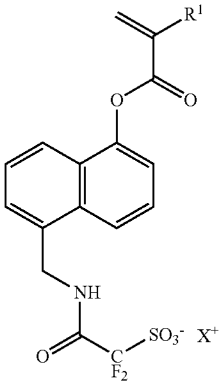
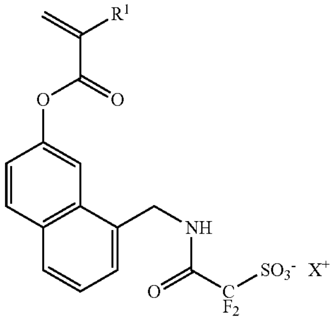

-continued
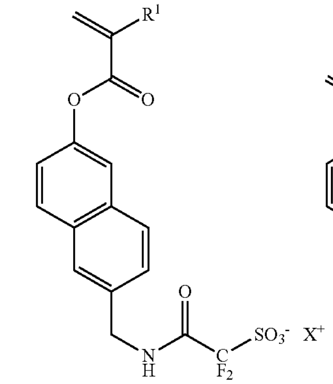
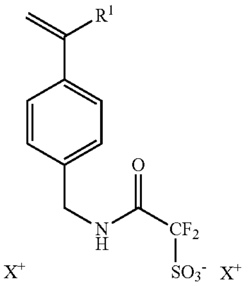
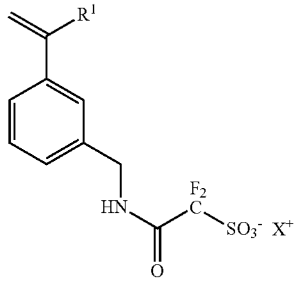
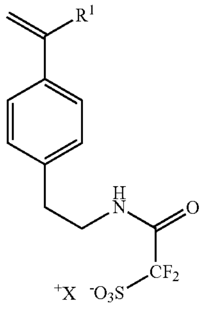
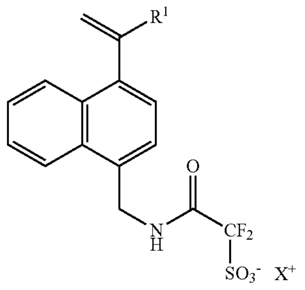
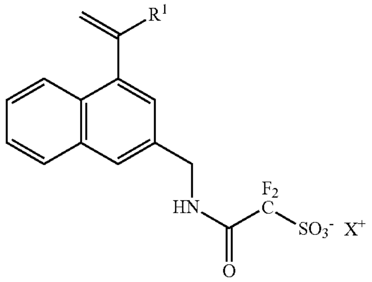
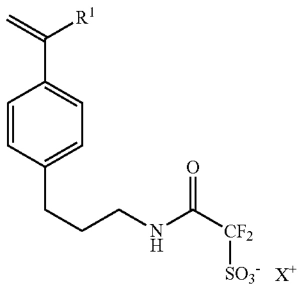
-continued
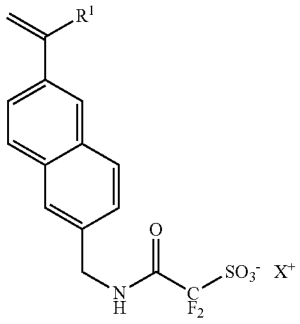
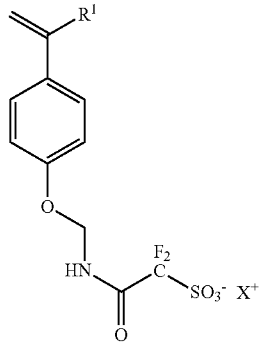
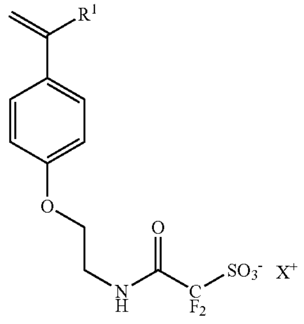
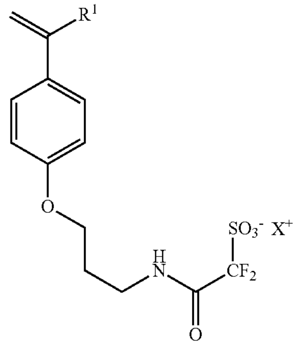
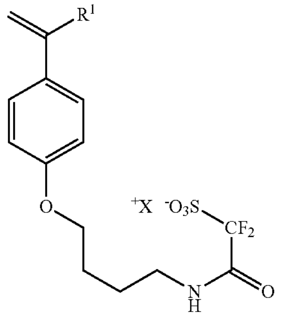
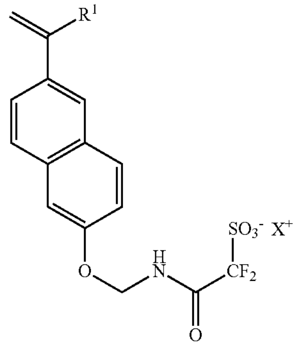

-continued
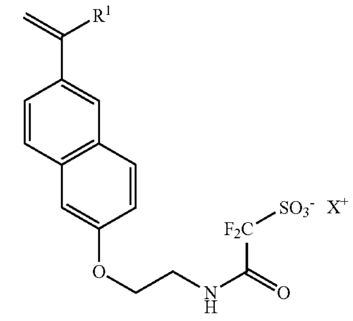
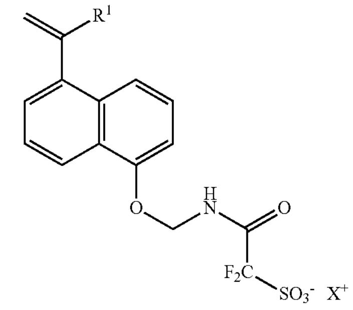
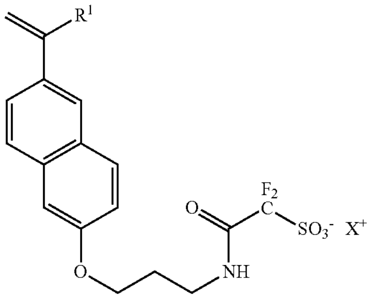
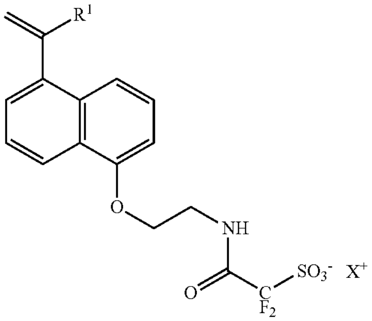
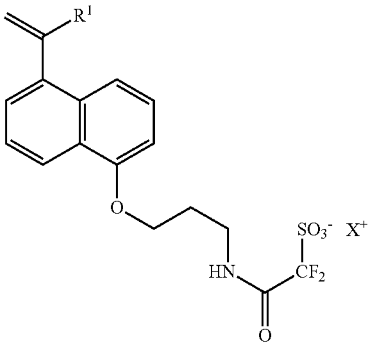
-continued
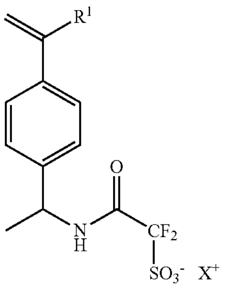
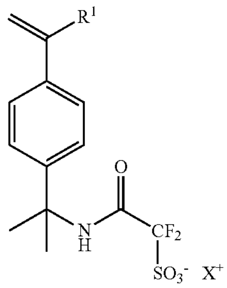
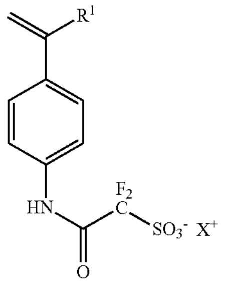
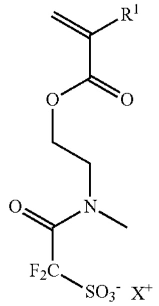
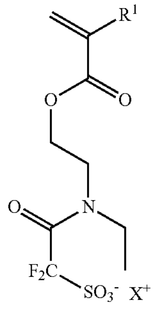
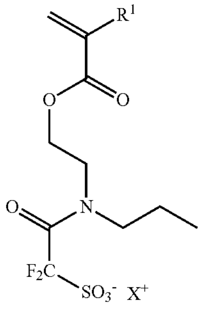
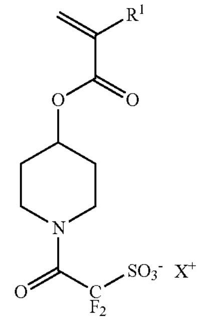
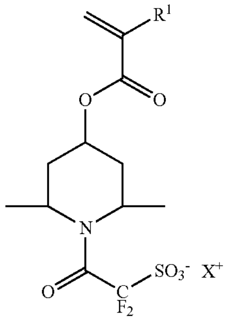
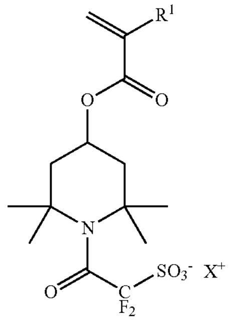
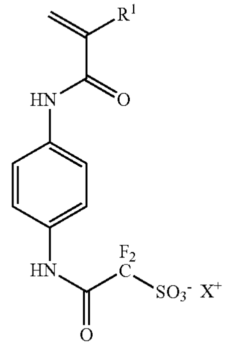

-continued

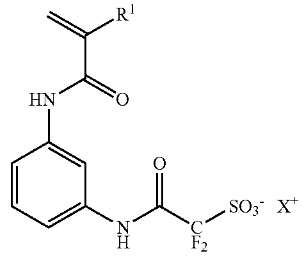

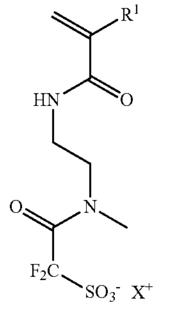

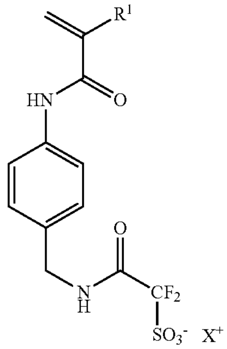

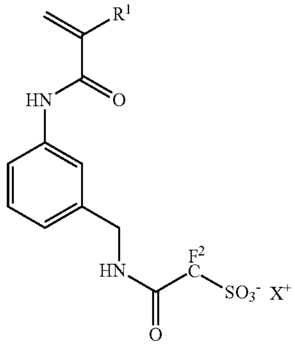

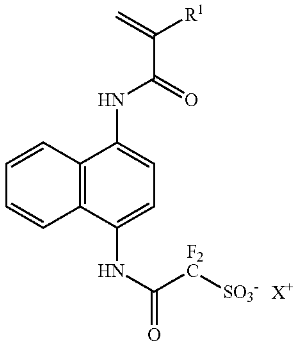

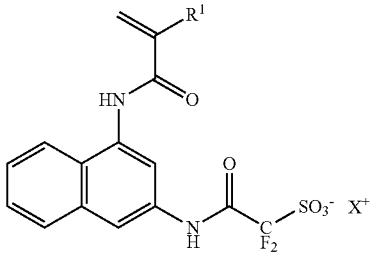

wherein $R^1$ has the same meaning as defined above; and "X" represents a hydrogen atom, a lithium atom, a sodium atom, a potassium atom, an amine compound, or a sulfonium compound.

It is preferred that the repeating unit "a" shown by the general formula (1) include one or more kinds selected from a repeating unit a1 shown by the following general formula (1-1) and a repeating unit a2 shown by the following general formula (1-2). That is, among the above-exemplified monomers, monomers to give a repeating unit a1 or a repeating unit a2 are particularly preferable, (1-1)

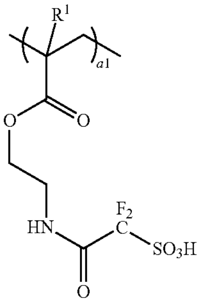

(1-2)

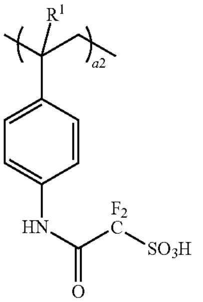

wherein $R^1$ has the same meaning as defined above; and a1 and a2 are each a number satisfying $0 \le a1 \le 1.0$, $0 \le a2 \le 1.0$, and $0 < a1 + a2 \le 1.0$.

By using such a component (B), the material can be improved in filterability, film-formability, affinity to an organic solvent and an organic substrate, and transmittance after film formation.

Also, the component (B) preferably further contains a repeating unit "b" shown by the following general formula (2). By containing the repeating unit "b", the conductivity can be further enhanced.

(2)

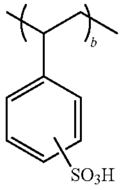

wherein "b" is a number satisfying $0 < b < 1.0$.

Illustrative examples of the monomer to give the repeating unit "b" include the following compounds,

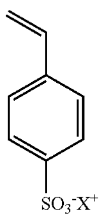

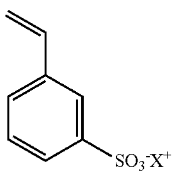

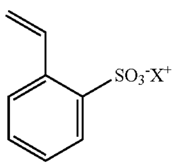

wherein X has the same meaning as defined above.

If X is an amine compound, (P1a-3) described in paragraph (0048) of Japanese Patent Laid-Open Publication No. 2013-228447 may be mentioned as examples.

Here, as mentioned before, "a" is a number satisfying 0<a≤1.0, preferably 0.2≤a≤1.0. If "a" is in the range of 0<a1.0 (namely, if the repeating unit "a" is contained), the effect of the present invention can be obtained; and if "a" is in the range of 0.2≤a≤1.0, a higher effect thereof can be obtained. Also, if the repeating unit "a" includes one or more repeating units selected from a1 and a2 as mentioned above, they are preferably 0≤a1≤1.0, 0≤a2≤1.0, and 0<a1+a2≤1.0, more preferably 0≤a1≤0.9, 0≤a2≤0.9, and 0.1≤a1+a2≤0.9, much more preferably 0≤a1≤0.8, 0≤a2≤0.8, and 0.2≤a1+a2≤0.8.

If the repeating unit "b" is contained, in view of enhancing the conductivity, "b" is preferably in the range of 0.3≤b<1.0, more preferably 0.3≤b≤0.8.

In addition, the proportion of the repeating unit "a" and the repeating unit "b" is preferably in the range of 0.2≤a≤0.7 and 0.3≤b≤0.8, more preferably 0.3≤a≤0.6 and 0.4≤b≤0.7.

In addition, the dopant polymer of the component (B) may contain a repeating unit "c" besides the repeating unit "a" and the repeating unit "b"; and examples of the repeating unit "c" include a styrene type, a vinylnaphthalene type, a vinylsilane type, acenaphthylene, indene, and vinylcarbazole.

Illustrative examples of the monomer to give the repeating unit "c" include the following compound.

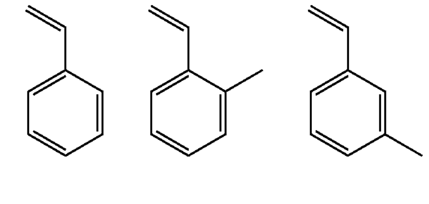

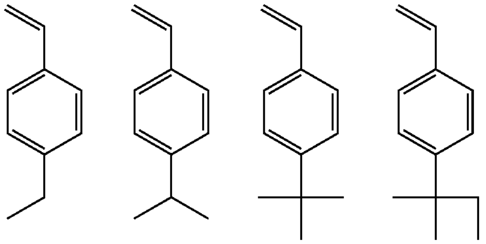

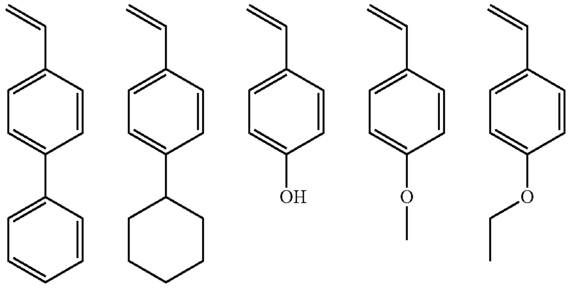

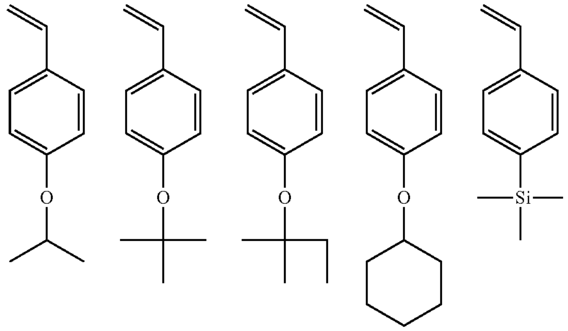

-continued

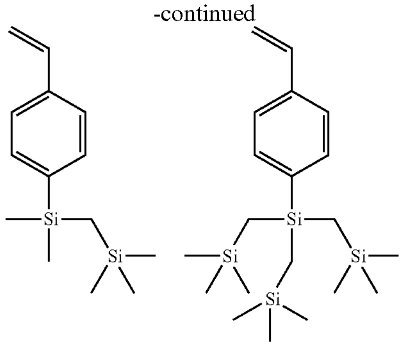

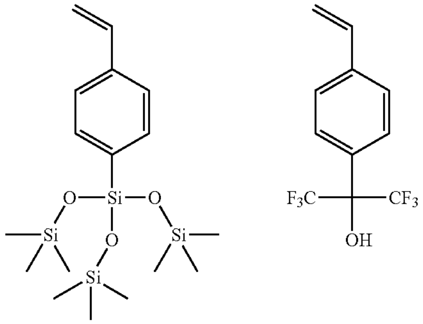

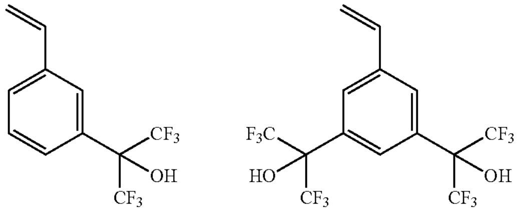

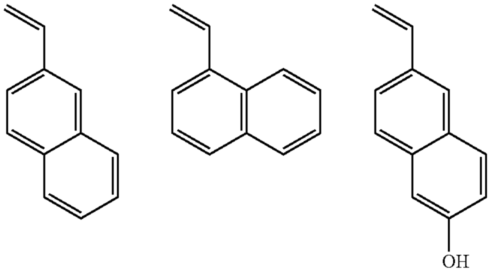

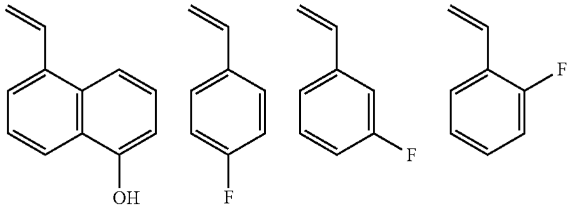

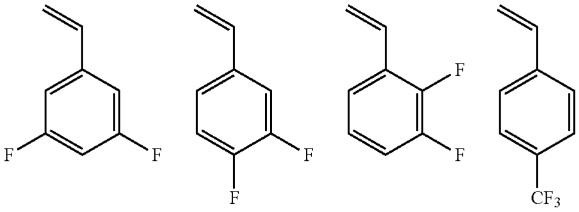

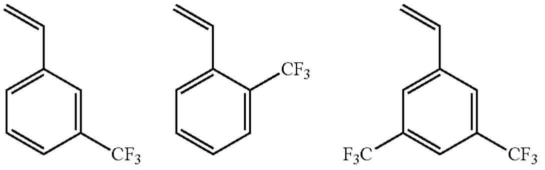

-continued
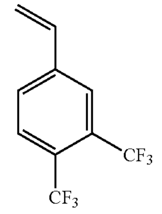
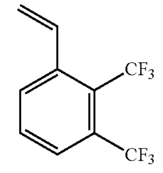
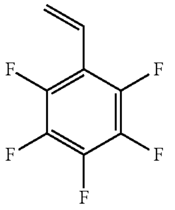
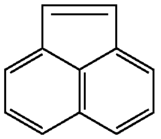
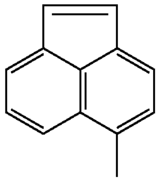
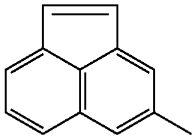
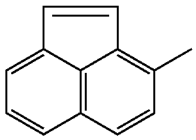
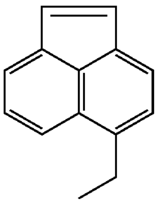
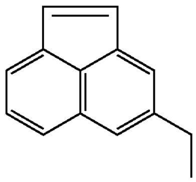
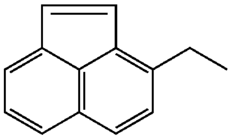
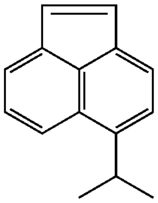
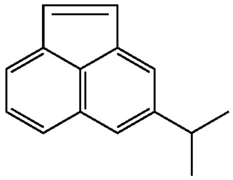
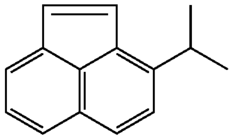
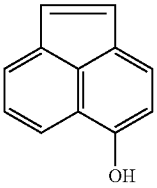
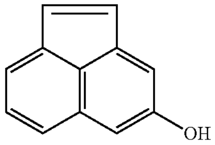
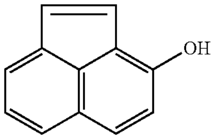
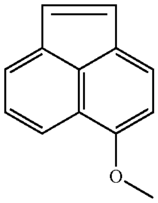
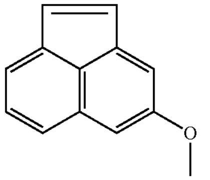
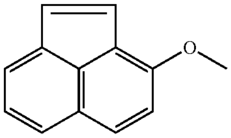
-continued
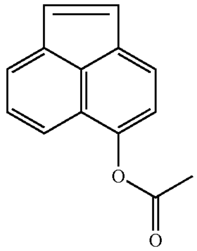
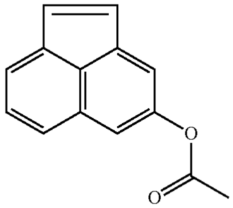
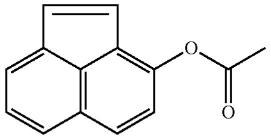
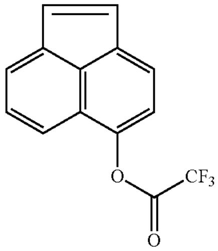
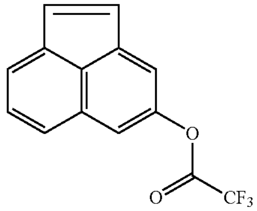
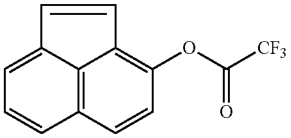
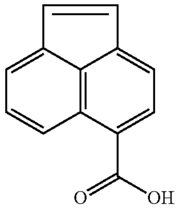
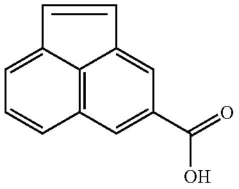
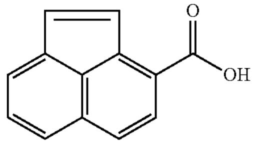
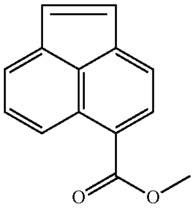
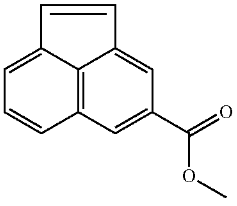
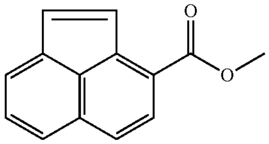
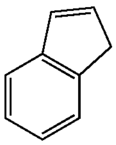
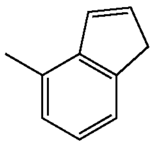
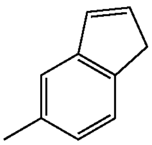
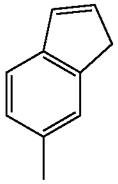
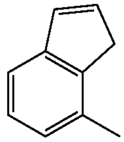
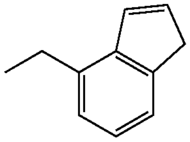

-continued
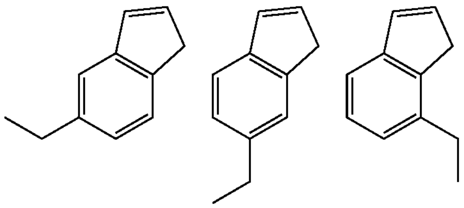
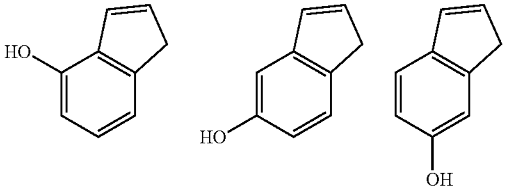
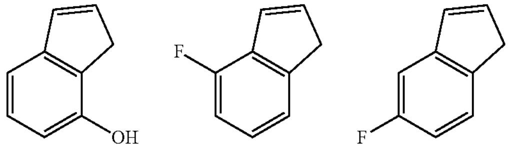
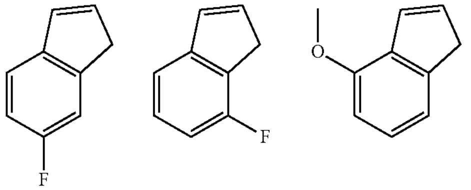
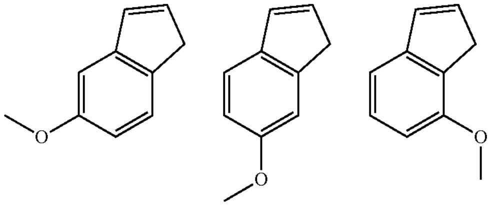
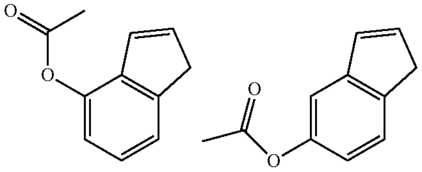
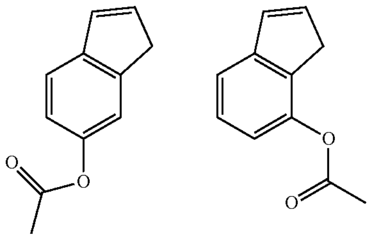
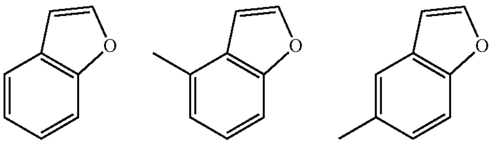
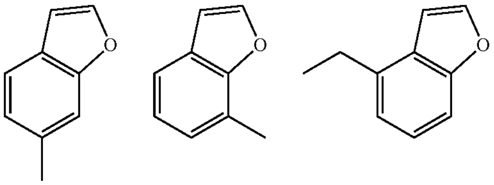
-continued
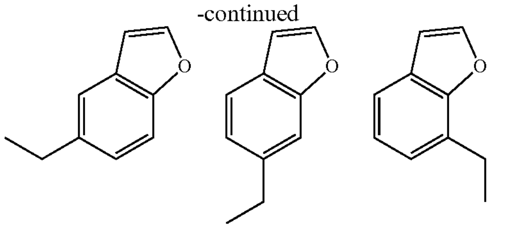
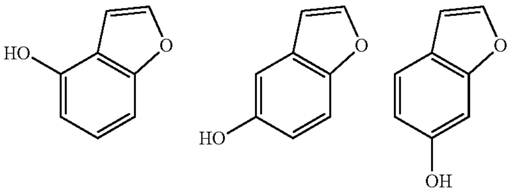
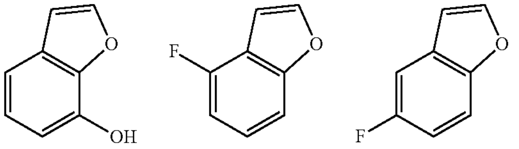
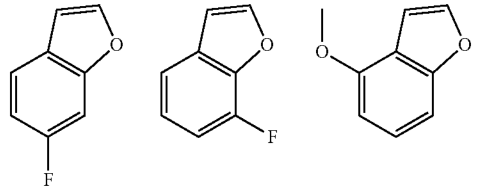
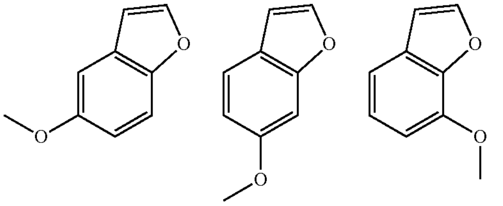
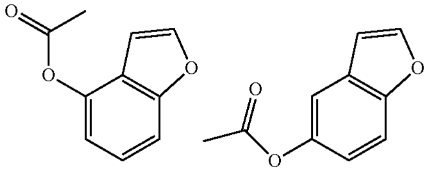
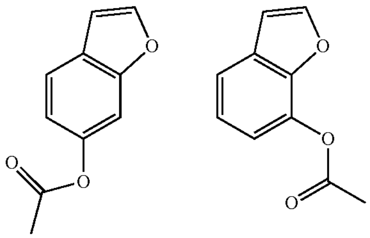
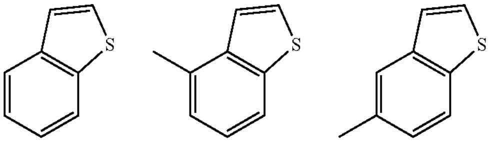
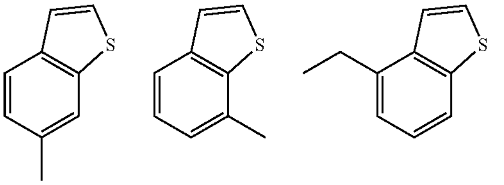

-continued

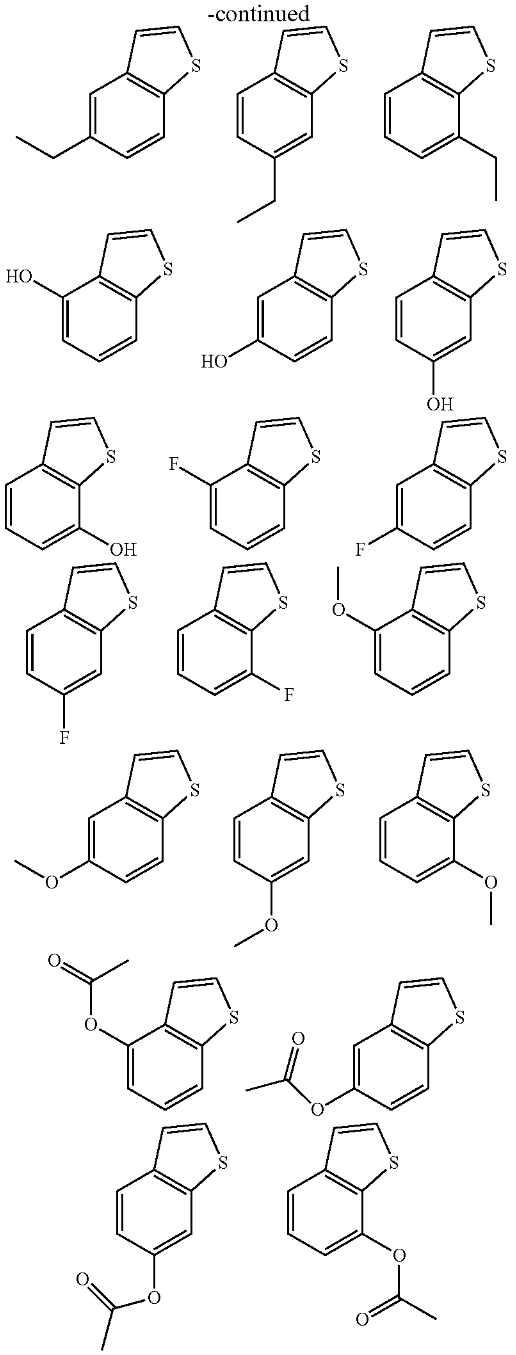

The dopant polymer of the component (B) may be synthesized, for example, by a method in which intended monomers to give the repeating units "a" to "c" as mentioned above are subjected to thermal polymerization in an organic solvent by adding a radical polymerization initiator, thereby obtaining a (co)polymer of the dopant polymer.

Examples of the organic solvent to be used in the polymerization include toluene, benzene, tetrahydrofuran, diethyl ether, dioxane, cyclohexane, cyclopentane, methyl ethyl ketone, and γ-butyrolactone.

Examples of the radical polymerization initiator include 2,2'-azobisisobutyronitrile (AIBN), 2,2'-azobis (2,4-dimethylvaleronitrile), dimethyl 2,2'-azobis (2-methylpropionate), benzoylperoxide, and lauroylperoxide.

The reaction temperature is preferably in the range of 50 to 80° C.; and the reaction time is preferably in the range of 2 to 100 hours, more preferably 5 to 20 hours.

In the dopant polymer of the component (B), the monomer to give the repeating unit "a" may be one kind or two or more kinds; and a combination of a methacryl type monomer and a styrene type monomer which enhance the polymerizability is preferable.

In the case that two or more kinds of monomer to give the repeating unit "a" are used, the respective monomers may be copolymerized randomly or as a block. When a block-copolymerized polymer (block copolymer) is formed, the sea-island structure is formed by agglomeration among the repeating unit portions composed of respective two or more repeating units "a", whereby generating a special structure around the dopant polymer; and as a result, the merit to enhance the conductivity may be expected.

The monomers to give the repeating units "a" to "c" may be copolymerized randomly, or each of these may be copolymerized as a block. In this case, similarly to the case of the repeating unit "a" as mentioned above, the merit to enhance the conductivity may be expected by forming a block copolymer.

In the case that the random copolymerization is carried out by a radical polymerization, the polymerization is generally performed by heating a mixture containing monomers to be copolymerized and a radical polymerization initiator. When the polymerization of a first monomer is initiated in the presence of a radical polymerization initiator and then followed by addition of a second monomer, the resulting polymer has a structure that the first monomer is polymerized at one side of the polymer molecule, and the second monomer is polymerized at the other side. In this case, however, the repeating units of the first and second monomers are mixedly present at the middle portion, thus it has a different structure from the block copolymer. In order to form the block copolymer by radical polymerization, living radical polymerization is preferably used.

In a living radical polymerization method called RAFT polymerization (Reversible Addition Fragmentation chain Transfer polymerization), radicals at the polymer terminal are always living, so that it is possible to form a diblock copolymer composed of a block of the repeating unit of the first monomer and a block of the repeating unit of the second monomer by starting the polymerization with a first monomer, and then adding a second monomer at the time when the first monomer has been consumed. In addition, it is also possible to form a triblock copolymer by starting the polymerization with a first monomer, then adding a second monomer at the time when the first monomer has been consumed, and then adding a third monomer thereto.

The RAFT polymerization has the characteristic that the polymer having narrow molecular weight distribution (dispersity) can be obtained. In particular, when the RAFT polymerization is carried out by adding monomers all at once, a polymer having further narrower molecular weight distribution can be obtained.

Meanwhile, in the dopant polymer of the component (B), the molecular weight distribution (Mw/Mn) is preferably in the range of 1.0 to 2.0, particularly preferably in the range of narrower dispersity of 1.0 to 1.5. If the dispersity is narrow, lowering of transmittance of the conductive film which is formed from the conductive polymer composite using this polymer can be prevented.

To carry out the RAFT polymerization, a chain transfer agent is necessary; and illustrative examples thereof include 2-cyano-2-propylbenzo thioate, 4-cyano-4-phenylcarbonothioyl thiopentanoic acid, 2-cyano-2-propyldodecyl trithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl)disulfide, and bis(dodecylsulfanylthiocarbonyl)disalfide. Among them, 2-cyano-2-propylbenzo thioate is especially preferable.

If the dopant polymer of the component (B) contains the repeating unit "c", the proportion of the repeating units "a" to "c" is preferably in the range of $0<a\leq1.0$, $0\leq b<1.0$, and $0<c<1.0$, more preferably $0.1\leq a\leq0.9$, $0.1\leq b\leq0.9$, and $0<c\leq0.8$, much more preferably $0.2\leq a\leq0.8$, $0.2\leq b\leq0.8$, and $0<c\leq0.5$.

Also, it is preferred that $a+b+c=1$.

The weight-average molecular weight of the dopant polymer of the component (B) is in the range of 1,000 to 500,000, preferably 2,000 to 200,000. If the weight-average molecular weight is less than 1,000, the heat resistance is insufficient, and homogeneity in the composite solution with the component (A) becomes poor. On the other hand, if the weight-average molecular weight thereof is more than 500, 000, not only the conductivity deteriorates but also the viscosity increases thereby deteriorating the workability and decreasing the dispersibility into water or into an organic solvent.

The weight-average molecular weight (Mw) is a measured value in terms of polyethylene oxide, polyethylene glycol, or polystyrene by gel permeation chromatography (GPC) using water, dimethylformamide (DMF), or tetrahydrofuran (THF) as a solvent.

As to the monomer to constitute the dopant polymer of the component (B), a monomer having a sulfo group may be used. Alternatively, a monomer having a lithium salt, a sodium salt, a potassium salt, an ammonium salt, or a sulfonium salt of a sulfo group may be used as a monomer to perform a polymerization reaction, and after the polymerization, these salts may be converted into a sulfo group by an ion-exchange resin.

[Conductive Polymer Composite]

The conductive polymer composite of the present invention includes the above-mentioned π-conjugated polymer of the component (A) and the above-mentioned dopant polymer of the component (B), in which the dopant polymer of the component (B) forms the composite by coordinating with the π-conjugated polymer of the component (A).

It is preferable that the conductive polymer composite of the present invention have dispersibility in water or in an organic solvent; and if the conductive polymer composite has such a dispersibility, the film-formability by spin coating onto an inorganic substrate or an organic substrate (i.e. substrate on which an inorganic film or an organic film has been formed) as well as the flatness of the film can be made excellent.

(Method for Producing the Conductive Polymer Composite)

The composite of the components (A) and (B) may be obtained, for example, by adding a raw material monomer of the component (A) (preferably pyrrole, thiophene, aniline, or a derivative monomer thereof) into an aqueous solution of the component (B) or a water/organic solvent mixed solution of the component (B), and then adding an oxidant, and an oxidation catalyst, if needed, to perform an oxidative polymerization.

Illustrative examples of the oxidant and the oxidation catalyst include peroxodisulfate salts (i.e. persulfate salts) such as ammonium peroxodisulfate (i.e. ammonium persulfate), sodium peroxodisulfate (i.e. sodium persulfate), and potassium peroxodisulfate (i.e. potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As the reaction solvent to be used for the oxidative polymerization, water or a mixture of water and a solvent may be used. As the solvent to be used here is preferably miscible with water and can dissolve or disperse the component (A) and the component (B). Illustrative example thereof includes polar solvents such as N-methyl-2-pyrrolidone, N,N'-dimethylformamide, N,N'-dimethylacetamide, dimethyl sulfoxide, and hexamethyl phosphortriamide; alcohols such as methanol, ethanol, propanol, and butanol; polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds such as ethylene carbonate and propylene carbonate; cyclic ether compounds such as dioxane and tetrahydrofuran; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds such as 3-methyl-2-oxazolidinone; and nitrile compounds such as acetonitrile, glutaronitrile, methoxyacetonitrile, propionitrile, and benzonitrile. These solvents may be used singly or as a mixture of two or more of them. The blending amount of these water-miscible solvents is preferably 50% by mass or less with respect to entirety of the reaction solvents.

Besides the dopant polymer of the component (B), another anion capable of being doped into the π-conjugated polymer of the component (A) may be used. As to the anion like this, an organic acid is preferable in view of controlling the characteristic of de-doping from the π-conjugated polymer, and also in view of dispersibility, heat resistance, environment resistance, and so force of the conductive polymer composite. As the organic acid, there may be mentioned an organic carboxylic acid, phenols, an organic sulfonic acid, etc.

As to the organic carboxylic acid, acids of aliphatic, aromatic, or alicyclic compound having one, or two or more carboxy groups may be used. Illustrative examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoro-acetic acid, nitroacetic acid, and triphenylacetic acid.

Illustrative example of the phenols includes cresol, phenol, and xylenol.

As to the organic sulfonic acid, acids of aliphatic, aromatic, or alicyclic compound having one, or two or more sulfa groups may be used. Illustrative examples of the compound having one sulfa group include methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative examples of the compound containing two or more sulfo groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, anthracene disulfonic acid, butylanthracene disulfonic acid, 4-acetamide-4'-isothio-cyanatostilbene-2,2'-disulfonic acid, 4-acetamide-4'-isothio-cyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

These anions other than the component (B) may be added, before polymerization of the component (A), into a solution containing a raw material monomer of the component (A), the component (B), and an oxidant and/or an oxidative polymerization catalyst. Alternatively, it may be added into the conductive polymer composite (solution) which contains the component (A) after the polymerization and the component (B).

The composite including the component (A) and the component (B) thus obtained may be used after being pulverized by a homogenizer, a ball mill, or the like, if necessary.

For pulverization, a mixer/disperser which can apply a high shear force is preferably used. Illustrative examples of the mixer/disperser include a homogenizer, a high-pressure homogenizer, and a bead mill; among them, a high-pressure homogenizer is particularly preferable.

Illustrative examples of the high-pressure homogenizer include NanoVater (manufactured by Yoshida Kikai Co., Ltd.), Microfluidizer (manufactured by Powrex Corp.), and Ultimizer (manufactured by Sugino Machine Ltd.).

As the dispersion treatment using the high-pressure homogenizer, there may be mentioned a treatment in which the composite solutions before the dispersion treatment are collided from the opposite direction with each other under high pressure, or a treatment in which the solution is passed through an orifice or a slit under high pressure.

Before or after the pulverization, impurities may be removed by the measures such as filtration, ultrafiltration, and dialysis; and also, purification may be done by using a cationic ion-exchange resin, an anionic ion-exchange resin, a chelate resin, or the like.

The total content of the component (A) and the component (B) in the conductive polymer composite solution is preferably in the range of 0.05 to 5.0% by mass. If the total content of the component (A) and the component (B) is 0.05% by mass or more, sufficient conductivity can be obtained; and if it is 5.0% by mass or less, the uniform conductive coating film can be readily obtained.

The content of the component (B) is preferably such an amount that the sulfo group in the component (B) is in the range of 0.1 to 10 mole, more preferably 1 to 7 mole, per 1 mole of the component (A). If the content of the sulfo group in the component (B) is 0.1 mole or more, the doping effect to the component (A) is so high that sufficient conductivity can be secured. On the other hand, if the content of the sulfo group in the component (B) is 10 mole or less, the content of the component (A) also becomes appropriate, so that sufficient conductivity can be obtained.

Illustrative examples of the organic solvent that can be added to the polymerization reaction aqueous solution or can dilute the monomers include methanol, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and a mixture thereof.

The amount of the organic solvent to be used is preferably in the range of 0 to 1,000 mL, particularly preferably 0 to 500 mL, per 1 mole of the monomer. If the amount of the organic solvent is 1,000 mL or less, it is economical because the reaction vessel may not become too large.

[Other Additives]

(Surfactant)

In the present invention, a surfactant may be added to enhance the wettability to a body to be processed such as a substrate. As the surfactant, various surfactants of nonionic, cationic, and anionic type may be mentioned. Illustrative examples thereof include nonionic surfactants such as polyoxyethylene alkyl ether, polyoxyethylene alkyl phenyl ether, polyoxyethylene carboxylate, sorbitan ester, and polyoxyethylene sorbitan ester; cationic surfactants such as alkyltrimethylammonium chloride and alkylbenzylammonium chloride; anionic surfactants such as alkyl or alkylallyl sulfate salt, alkyl or alkylallyl sulfonate salt, and dialkyl sulfosuccinate salt; amphoteric surfactants such as an amino acid type and a betaine type; acetylene alcohol type surfactants; and an acetylene alcohol type surfactant whose hydroxy group is modified with polyethylene oxide or polypropylene oxide.

(Conductivity Enhancer)

In the present invention, an organic solvent other than the main solvent may be added to enhance the conductivity of the conductive polymer composite. The additive solvent may be exemplified by a polar solvent, and illustrative examples thereof include ethylene glycol, polyethylene glycol, dimethyl sulfoxide (DMSO), dimethylformamide (DMF), N-methyl-2-pyrrolidone (NMP), sulfolane, and a mixture thereof. The adding amount is preferably in the range of 1.0 to 30.0% by mass, particularly preferably 3.0 to 10.0% by mass.

(Neutralizer)

In the present invention, an aqueous solution of the conductive polymer composite has an acidic pH. For the purpose of neutralizing it, nitrogen-containing aromatic cyclic compound described in paragraphs (0033) to (0045) of Japanese Patent Laid-Open Publication No. 2006-096975 or a cation described in paragraph (0127) of Japanese Patent No. 5264723 may be added to adjust the solution to neutral pH. By adjusting the pH of solution to near neutral, rust occurrence can be prevented when applied to a printer.

Thus, the conductive polymer composite of the present invention as described above has excellent filterability and film-formability by spin coating, and can form a conductive film having high transparency and low surface roughness.

[Conductive Film]

The conductive polymer composite (solution) thus obtained can form a conductive film by applying it onto a body to be processed such as a substrate. Illustrative examples of the method of applying the conductive polymer composite (solution) include coating by a spin coater, a bar coater, soaking, comma coating, spray coating, roll coating, screen printing, flexographic printing, gravure printing, and ink jet printing. After applying, heat treatment by using a hot-air circulating furnace, a hot plate, or the like, or irradiation with IR light, UV light, or the like may be carried out, whereby the conductive film can be formed.

As explained above, the conductive polymer composite of the present invention can form a conductive film by applying it onto a substrate or the like. In addition, the conductive film thus formed can be used as a transparent electrode layer and a hole injection layer because it has excellent conductivity and transparency.

[Substrate]

Also, the present invention provides a substrate having a conductive film formed thereon, wherein the conductive film is formed from the conductive polymer composite of the present invention.

Illustrative examples of the substrate include a glass substrate, a quartz substrate, a photomask blank substrate, a resin substrate, a silicon wafer, compound semiconductor wafers such as a gallium arsenic wafer and an indium phosphorous wafer, and a flexible substrate. In addition, it may also be used as an anti-static top coat by applying it onto a photoresist film.

As mentioned above, in the conductive polymer composite of the present invention, the dopant polymer of the component (B) which contains a superacidic sulfo group forms the composite together with the π-conjugated polymer of the component (A), whereby low viscosity, good filterability, and superior film-formability by spin coating are provided. In addition, when a film is formed from the inventive composite, a conductive film having excellent transparency, flatness, durability, and conductivity can be formed. Further, the above-mentioned conductive polymer composite has excellent affinity to an organic solvent and an organic substrate, and it has excellent film-formability onto both an organic substrate and an inorganic substrate.

In addition, the conductive film formed by the above-mentioned conductive polymer composite has excellent conductivity, transparency, and the like, so that this film may function as a transparent electrode layer.

EXAMPLES

Hereinafter, the present invention will be specifically described with reference to Synthesis Examples, Preparation Examples, Comparative Preparation Example, Examples, and Comparative Example, but the present invention is not restricted thereto.

[Synthesis of Dopant Polymer]

Synthesis Examples 1 to 4

Under nitrogen atmosphere, a monomer to give each repeating unit was dissolved to methanol stirred at 64° C. To this was added dropwise a solution in which dimethyl 2,2'-azobis(isobutyrate) had been dissolved in methanol, over 4 hours. The mixture was further stirred for 4 hours. After cooling to room temperature, the mixture was added dropwise to ethyl acetate under vigorous stirring. The resulting solid was collected by filtration, and dried under vacuum at 50° C. for 15 hours to obtain a white polymer. The obtained white polymer was dissolved in methanol, and the sulfonium salt was converted into a sulfo group by use of an ion-exchange resin to exchange the cation in the polymer to a hydrogen atom. In this manner, the following Dopant polymers 1 to 4 were obtained.

Dopant Polymer 1

Weight-average molecular weight (Mw)=46,000

Molecular weight distribution (Mw/Mn)=1.61

Dopant polymer 1

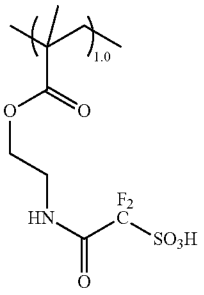

Dopant Polymer 2

Weight-average molecular weight (Mw)=51,000

Molecular weight distribution (Mw/Mn)=1.75

Dopant polymer 2

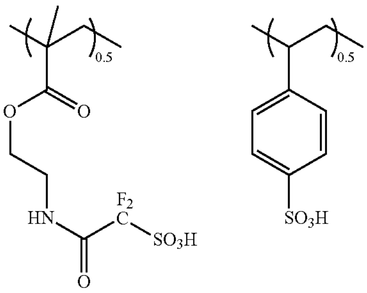

Dopant Polymer 3

Weight-average molecular weight (Mw)=53,000

Molecular weight distribution (Mw/Mn)=1.79

Dopant polymer 3

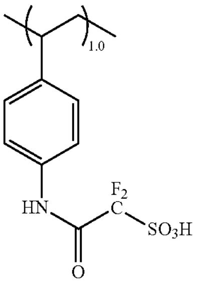

Dopant Polymer 4

Weight-average molecular weight (Mw)=39,300

Molecular weight distribution (Mw/Mn)=1.91

Dopant polymer 4

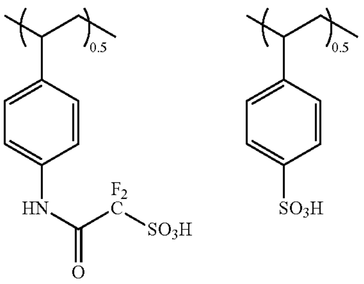

[Preparation of Conductive Polymer Composite Dispersion]

Preparation Example 1

A solution in which 12.5 g of Dopant polymer 1 had been dissolved in 1,000 mL of ultrapure water was mixed with 3.82 g of 3,4-ethylenedioxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times to obtain Conductive polymer composite dispersion 1 having a blue color with a concentration of 1.3% by mass.

Conditions of the ultrafiltration were as follows.

Cut-off molecular weight of the ultrafiltration membrane: 30 K

Cross-flow method

Flow rate of the supply solution: 3,000 mL/min

Partial membrane pressure: 0.12 Pa

Meanwhile, also in other Preparation Examples, the ultrafiltration was carried out with the same conditions.

Preparation Example 2

Procedure of Preparation Example 1 was repeated, except that 11.0 g of Dopant polymer 2 was used in place of 12.5 g of Dopant polymer 1, the blending amount of 3,4-ethylenedioxythiophene was changed to 2.41 g, the blending amount of sodium persulfate was changed to 5.31 g, and the blending amount of ferric sulfate was changed to 1.50 g, to obtain Conductive polymer composite dispersion 2.

Preparation Example 3

Procedure of Preparation Example 1 was repeated, except that 12.0 g of Dopant polymer 3 was used in place of 12.5 g of Dopant polymer 1, the blending amount of 3,4-ethylenedioxythiophene was changed to 2.72 g, the blending amount of sodium persulfate was changed to 6.00 g, and the blending amount of ferric sulfate was changed to 1.60 g, to obtain Conductive polymer composite dispersion 3.

Preparation Example 4

Procedure of Preparation Example 1 was repeated, except that 11.8 g of Dopant polymer 4 was used in place of 12.5 g of Dopant polymer 1, 4.50 g of ammonium persulfate was used in place of 8.40 g of sodium persulfate, the blending amount of 3,4-ethylenedioxythiophene was changed to 2.04 g, the blending amount of ferric sulfate was changed to 1.23 g, to obtain Conductive polymer composite dispersion 4.

Preparation Example 5

A solution in which 10.0 g of Dopant polymer 2 had been dissolved in 1,000 mL of ultrapure water was mixed with 4.65 g of 3,4-ethylenedithiothiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times to obtain Conductive polymer composite dispersion 5 having a blue color with a concentration of 1.3% by mass.

Preparation Example 6

A solution in which 10.0 g of Dopant polymer 2 had been dissolved in 1,000 mL of ultrapure water was mixed with 3.87 g of 3,4-dimethoxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times to obtain Conductive polymer composite dispersion 6 having a blue color with a concentration of 1.3% by mass.

Preparation Example 7

A solution in which 10.0 g of Dopant polymer 2 had been dissolved in 1,000 mL of ultrapure water was mixed with 4.62 g of (2,3-dihydrothieno[3,4-b][1,4]dioxin-2-yl)methanol at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times to obtain Conductive polymer composite dispersion 7 having a blue color with a concentration of 1.3% by mass.

Preparation Example 8

A solution in which 10.0 g of Dopant polymer 2 had been dissolved in 1,000 mL of ultrapure water was mixed with 4.16 g of 3,4-propylenedioxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 ml of the treated solution was removed by ultrafiltration. This procedure was repeated 5 times to obtain Conductive polymer composite dispersion 8 having a blue color with a concentration of 1.3% by mass.

Comparative Preparation Example 1

A solution in which 83.3 g of an aqueous solution of polystyrene sulfonic acid (concentration of 18.0% by mass, manufactured by Aldrich Co., Ltd.) had been diluted with 250 mL of ion-exchanged water was mixed with 5.0 g of 3,4-ethylenedioxythiophene at 30° C. Except for it, procedure of Preparation Example 1 was repeated to obtain Comparative conductive polymer composite dispersion 1 (PEDOT-PSS Dispersion) having a blue color with a concentration of 1.3% by mass. In this Comparative conductive polymer composite dispersion 1, only polystyrene sulfonic acid was contained as a dopant polymer.

EXAMPLES

Each of the Conductive polymer composite dispersions 1 to 8 (20 g) with a concentration of 1.3% by mass obtained in Preparation Examples 1 to 8 was mixed with 5 g of dimethyl sulfoxide and 0.5 g of Surfynol 465, which is a surfactant and defoamer. Then, the resulting mixture was filtrated by using a reproduced cellulose filter having a pore diameter of 0.45 μm (manufactured by Advantec MFS, Inc.) to prepare a conductive polymer composition, and the respective compositions were designated as Examples 1 to 8.

COMPARATIVE EXAMPLE

A conductive polymer composition was prepared in the same manner as in Examples, except for using Comparative conductive polymer composite dispersion 1 obtained in Comparative Preparation Example 1, and the composition was designated as Comparative Example 1.

Each of the conductive polymer compositions of Examples and Comparative Example thus prepared was evaluated by the methods as shown below.

(Filterability)

In the preparation of the conductive polymer compositions of Examples and Comparative Example, at the time of the filtration using the reproduced cellulose filter having a pore diameter of 0.45 μm, if the composition could be filtrated through the filter, this is shown by "good", and if the composition could not be filtrated through the filter due to clogging, this is shown by "poor" in Table 1.

APPLICABILITY

Firstly, the conductive polymer composition was applied by spin coating onto a Si wafer by using 1H-360S SPIN-COATER (manufactured by MIKASA Co., Ltd.) so as to have a film thickness of 100±5 nm. Then, baking was performed for 5 minutes in an accuracy incubator at 120° C. to remove the solvent, thereby the conductive film was obtained. The refractive index (n and k) at a wavelength of 636 nm was measured with respect to the conductive film by using VASE (manufactured by J. A. Woollam Co., Inc.), a spectroscopic ellipsometer with the type of variable incident angle. If the uniform film could be formed, this is shown by "good", and if a defect derived from particles or a partial striation was found in the film although the measurement of the refractive index could be carried out, this is shown by "poor" in Table 1.

(Transmittance)

From the refractive index (k) measured by using the spectroscopic ellipsometer with the type of variable incident angle (VASE), the transmittance of the light with a wavelength of 550 nm in a film thickness (FT) of 200 nm was calculated. These results are shown in Table 1.

(Conductivity)

Firstly, 1.0 mL of the conductive polymer composition was dropped onto a $SiO_2$ wafer having a diameter of 4 inches (100 mm), and 10 seconds later, the whole wafer was spin-coated by using a spinner. The spin coating conditions were adjusted so as to give a film thickness of 100±5 nm. Then, baking was performed for 5 minutes in an accuracy incubator at 120° C. to remove the solvent, thereby the conductive film was obtained.

The conductivity (S/cm) of the conductive film thus obtained was calculated from the surface resistivity (Q/D) measured by Hiresta-UP MCP-HT450 and Loresta-GP MCP-T610 (both are manufactured by Mitsubishi Chemical corp.) and measured film thickness. These results are shown in Table 1.

(Surface Roughness)

Similarly to the evaluation method of the conductivity, the conductive film was formed on a $SiO_2$ wafer having a diameter of 4 inches (100 mm). The RMS (root mean square roughness) was measured by AFM NANO-IM-8 (manufactured by Image Metrology A/S). These results are shown in Table 1.

(Viscosity)

The solid concentrations of the conductive polymer compositions were adjusted to 1.3% by mass, and the solution temperature thereof was set at 25° C. The viscosity of the composition immediately after preparation was measured by taking 35 mL of the solution into a measurement cell for exclusive use attached to a tuning fork vibration viscometer SV-10 (manufactured by A&D Co., Ltd.). These results are shown in Table 1.

TABLE 1

| | Filterability | Applicability | Viscosity (mPa · S) | Surface roughness (RMS, nm) | Transmittance at wavelength of 550 nm in FT of 200 nm (%) | Conductivity (S/cm) |
|---|---|---|---|---|---|---|
| Example 1 | good | good | 19.7 | 0.15 | 94 | 102 |
| Example 2 | good | good | 25.6 | 0.19 | 91 | 165 |
| Example 3 | good | good | 22.5 | 0.25 | 95 | 110 |
| Example 4 | good | good | 28.6 | 0.22 | 92 | 180 |
| Example 5 | good | good | 24.0 | 0.22 | 91 | 135 |
| Example 6 | good | good | 27.1 | 0.26 | 92 | 145 |
| Example 7 | good | good | 27.6 | 0.16 | 93 | 151 |
| Example 8 | good | good | 29.6 | 0.26 | 92 | 125 |
| Comparative Example 1 | poor | poor | 65.0 | 0.28 | 85 | 460 |

As shown in Table 1, Examples 1 to 8, which contained polythiophene as the π-conjugated polymer and further contained the dopant polymer having the repeating unit "a", showed excellent filterability, and also could give a uniform coat film by spin coating. In addition, they showed high conductivity, excellent transmittance in the visible light of λ=550 nm, and excellent surface roughness.

On the other hand, Comparative Example 1, which used polystyrene sulfonic acid not having the repeating unit "a" as the dopant polymer, showed poor filterability due to high viscosity thereof, and therefore, striation derived from particles and foams by spin coating was formed on the coat film, and a uniform coat film could not be obtained. In addition, the transmittance in the visible light of λ=550 nm and surface roughness thereof were inferior to those of Examples 1 to 8, even though the conductivity was higher.

As described above, it was revealed that the conductive polymer composite of the present invention exhibits low viscosity, excellent filterability and superior film-formability by spin coating, and also can form a hole injection layer and a conductive film having excellent transparency, flatness, durability and conductivity when the film is formed from the composite.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A conductive polymer composite comprising:

(A) a π-conjugated polymer, and (B) a dopant polymer which contains a repeating unit shown by the following general formula (1) and having a weight-average molecular weight in the range of 1,000 to 500,000, (1)

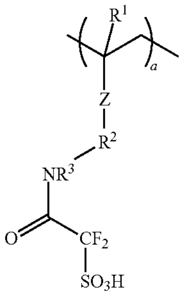

wherein $R^1$ represents a hydrogen atom or a methyl group; $R^2$ represents any of a single bond, an ester group, and a linear, branched, or cyclic hydrocarbon group having 1 to 12 carbon atoms, the hydrocarbon group optionally containing any one or more of groups selected from an ether group, an ester group, and an amide group; "Z" represents any of a single bond, a phenylene group, a naphthylene group, an ether group, and an ester group; $R^3$ represents a hydrogen atom or an alkyl group having 1 to 4 carbon atoms, and may be bonded to $R^2$ to form a ring; and "a" is a number satisfying $0<a\leq 1.0$.

2. The conductive polymer composite according to claim 1, wherein the repeating unit in the component (B) includes one or more kinds selected from the following general formula (1-1) and the following general formula (1-2), (1-1)

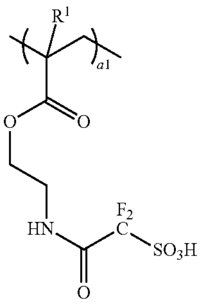

(1-2)

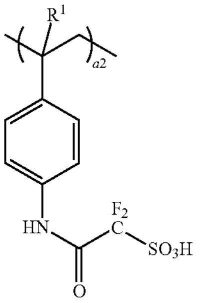

wherein $R^1$ has the same meaning as defined above; and a1 and a2 are each a number satisfying $0\leq a1\leq 1.0$, $0\leq a2\leq 1.0$, and $0<a1+a2\leq 1.0$.

3. The conductive polymer composite according to claim 2, wherein the component (B) further contains a repeating unit shown by the following general formula (2), (2)

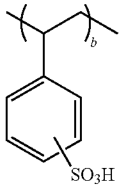

wherein "b" is a number satisfying $0<b<1.0$.

4. The conductive polymer composite according to claim 3, wherein the component (B) is a block copolymer.

5. The conductive polymer composite according to claim 2, wherein the component (B) is a block copolymer.

6. The conductive polymer composite according to claim 2, wherein the component (A) is a polymer formed by polymerization of one or more precursor monomers selected from the group consisting of pyrrole, thiophene, selenophene, tellurophene, aniline, a polycyclic aromatic compound, and a derivative thereof.

7. The conductive polymer composite according to claim 2, wherein the conductive polymer composite has dispersibility in water or in an organic solvent.

8. A substrate having a conductive film formed thereon, wherein the conductive film is formed from the conductive polymer composite according to claim 2.

9. The conductive polymer composite according to claim 1, wherein the component (B) further contains a repeating unit shown by the following general formula (2), (2)

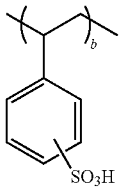

wherein "b" is a number satisfying $0<b<1.0$.

10. The conductive polymer composite according to claim 9, wherein the component (B) is a block copolymer.

11. The conductive polymer composite according to claim 9, wherein the component (A) is a polymer formed by polymerization of one or more precursor monomers selected from the group consisting of pyrrole, thiophene, selenophene, tellurophene, aniline, a polycyclic aromatic compound, and a derivative thereof.

12. The conductive polymer composite according to claim 9, wherein the conductive polymer composite has dispersibility in water or in an organic solvent.

13. A substrate having a conductive film formed thereon, wherein the conductive film is formed from the conductive polymer composite according to claim 9.

14. The conductive polymer composite according to claim 1, wherein the component (B) is a block copolymer.

15. The conductive polymer composite according to claim 14, wherein the component (A) is a polymer formed by polymerization of one or more precursor monomers selected from the group consisting of pyrrole, thiophene, selenophene, tellurophene, aniline, a polycyclic aromatic compound, and a derivative thereof.

16. The conductive polymer composite according to claim 14, wherein the conductive polymer composite has dispersibility in water or in an organic solvent.

17. The conductive polymer composite according to claim 1, wherein the component (A) is a polymer formed by polymerization of one or more precursor monomers selected from the group consisting of pyrrole, thiophene, selenophene, tellurophene, aniline, a polycyclic aromatic compound, and a derivative thereof.

18. The conductive polymer composite according to claim 1, wherein the conductive polymer composite has dispersibility in water or in an organic solvent.

19. A substrate having a conductive film formed thereon, wherein the conductive film is formed from the conductive polymer composite according to claim 1.

20. The substrate according to claim 19, wherein the conductive film functions as a transparent electrode layer.

* * * * *